US005781077A

United States Patent [19]

Leitch et al.

[11] Patent Number: 5,781,077

[45] Date of Patent: Jul. 14, 1998

[54] REDUCING TRANSFORMER INTERWINDING CAPACITANCE

[75] Inventors: Jim Rodger Leitch, Glasgow; Andrew Notman, Lothian, both of Scotland

[73] Assignee: Burr-Brown Corporation, Tucson, Ariz.

[21] Appl. No.: 790,158

[22] Filed: Jan. 28, 1997

(Under 37 CFR 1.47)

[51] Int. Cl.$^6$ .............................. H01F 27/28; H02H 1/04; H03C 3/00; H03D 3/00

[52] U.S. Cl. .......................... 332/117; 329/315; 336/232; 361/110

[58] Field of Search ..................................... 332/117, 129; 329/315, 322; 327/165, 168, 551, 594; 336/200, 207, 232; 361/110

[56] References Cited

U.S. PATENT DOCUMENTS

| | | | |
|---|---|---|---|
| 2,832,935 | 4/1958 | Tank | 333/29 |
| 3,058,078 | 10/1962 | Hoh | 336/232 X |
| 4,313,152 | 1/1982 | Vranken | 336/232 X |
| 4,342,143 | 8/1982 | Jennings | 29/25.42 |
| 4,451,812 | 5/1984 | Vescovi et al. | 336/84 |
| 4,641,114 | 2/1987 | Person | 331/141 |
| 4,816,784 | 3/1989 | Rabjohn | 333/24 |
| 5,051,712 | 9/1991 | Naito et al. | 333/185 |
| 5,353,001 | 10/1994 | Meinel et al. | 336/83 |
| 5,392,019 | 2/1995 | Ohkubo | 336/200 |
| 5,598,327 | 1/1997 | Somerville et al. | 336/232 X |

*Primary Examiner*—David Mis

*Attorney, Agent, or Firm*—Schnader Harrison Segal & Lewis LLP; N. Stephan Kinsella

[57] ABSTRACT

A transformer. According to one embodiment, the planar transformer has a first winding, a first conducting surface adjacent to the first winding, a second winding and a second conducting surface adjacent to the second winding. The first conducting surface is coupled to a first ground and the second conducting surface is coupled to a second ground.

23 Claims, 3 Drawing Sheets

100

200

300

400

FIG. 6
500
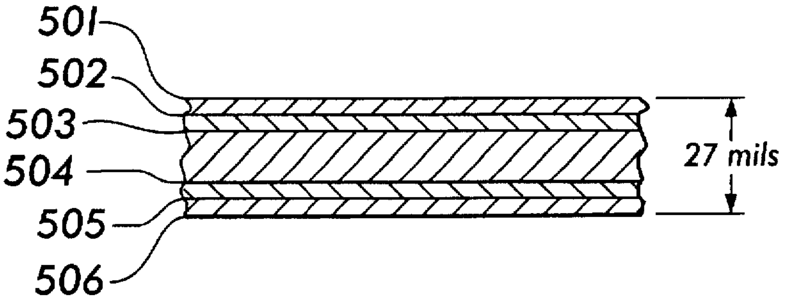
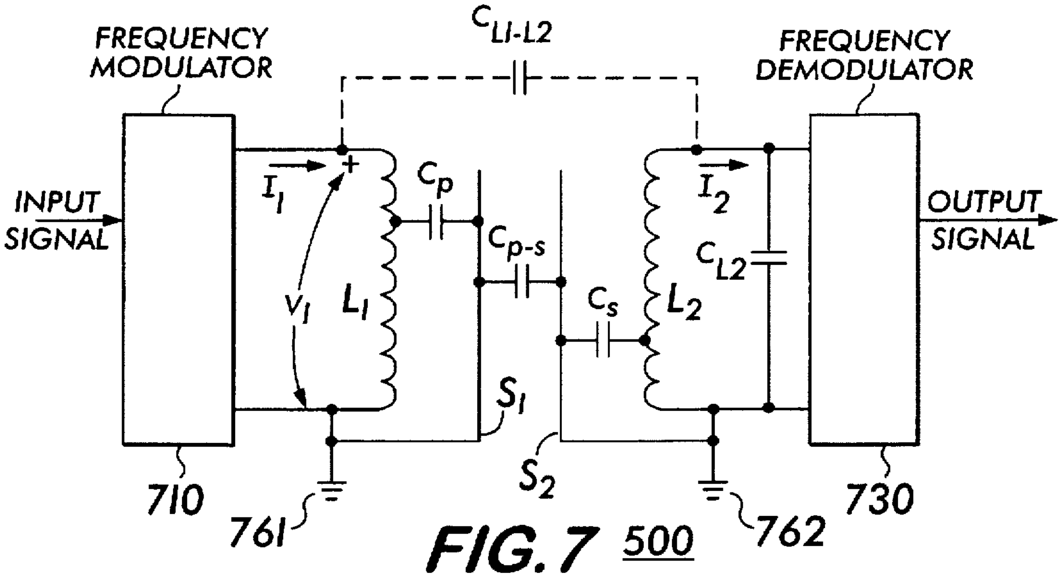
FIG. 7 500
FIG. 8
800
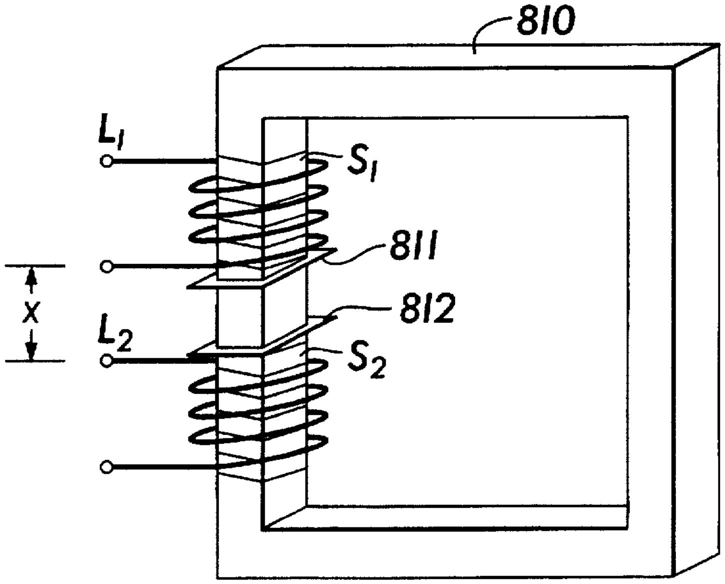

REDUCING TRANSFORMER INTERWINDING CAPACITANCE

BACKGROUND OF THE INVENTION

1. Field of the Invention

The present invention relates to transformers, and, in particular, to the interwinding capacitance of transformers.

2. Description of the Related Art

This invention relates to transformers. Transformers are often used in devices such as DC—DC converters and other applications. DC—DC converters are often used to provide isolated power supply to power devices such as isolation amplifiers (also sometimes known as "iso amps"). Isolation amplifiers may be used to buffer signals, such as those that are transmitted over relatively long distances, and should be driven by isolated power supplies to help provide for isolation. In an isolation amplifier, an input DC voltage or signal is applied to a modulator which in turn applies a modulated version of the DC voltage to the primary winding of the transformer. This produces a square wave voltage with an AC component across the primary winding, which induces, through magnetic coupling, a corresponding AC voltage across the secondary winding of the transformer, which may be rectified to provide an output DC voltage or signal isolated from the input DC voltage or signal.

An exemplary prior art DC—DC converter circuit 100 is illustrated in FIG. 1, having input voltage $V_{IN}$, modulator 110, transformer 120, a rectifier 150, and iso amp 140. Transformer 120 comprises primary winding 121, secondary winding 122 isolated from primary winding 121, and core 123. Input DC voltage $V_{IN}$ is modulated by modulator 110 to provide a square wave across primary winding 121. Modulator 110 may operate by alternatively connecting and disconnecting $V_{IN}$ across the terminals of primary winding 121 in accordance with a frequency generated by an oscillator device (not shown). The combination of oscillator and modulator 110 is sometimes referred to as a "chopper" or chopping device since it is used to "chop" the input voltage into an output square wave. The square wave voltage across primary winding or coil 121 induces a square wave voltage across secondary winding 122 via magnetic flux conducted through core 123. This square wave voltage across secondary winding 122 may have a magnitude the same as or different from the magnitude of the square wave across primary winding 121, depending upon the ratio of turns of the primary and secondary windings 121, 122, and other factors, and is rectified by rectifier 150 to provide $V_{OUT}$. $V_{OUT}$ is used to power iso amp 140, which provides for buffer amplification of an input signal at terminal 141 to provide a buffered output signal at terminal 142.

Transformers are also utilized in other devices and applications, including isolated signal or data coupling devices. In a data coupling device, an input signal is modulated, for example by a frequency-modulator, to provide a frequency-modulated AC signal, at a given carrier frequency. This AC signal is applied to the primary winding of the transformer. A corresponding AC signal is generated at the secondary winding which may then be used to reconstruct the original signal, for example with a demodulator. Such isolation devices are sometimes said to provide a signal or high voltage barrier, since the transformer windings are electrically isolated from one another.

An exemplary prior art data coupling circuit 200 is illustrated in FIG. 2, having frequency modulator 210, transformer 220, and frequency demodulator 230. Transformer 220 comprises primary winding 221, secondary winding 222 isolated from primary winding 221, and core 223. Frequency modulator 210 receives an input signal at terminal 201, and converts this to a frequency-modulated voltage applied to primary winding 221. This induces a corresponding AC voltage across secondary winding 222, which is demodulated by frequency demodulator 230 to provide an output signal at terminal 202. Circuit 200 may be configured so that this output signal tracks changes in the input signal, but also provides for a voltage barrier between these signals because of the electrical isolation between the modulator and demodulator sides of circuit 200.

In devices for which isolation is important between the primary and secondary windings of the transformer, these windings are thus typically electrically isolated from one another, as explained above. Transient noise such as a voltage spike caused by device switching, electrostatic discharge, and other causes may be applied to the primary winding or to the circuit to which it is electrically coupled. Referring once more to FIG. 2, for example, noise may be applied to terminal 201 of frequency modulator 210 or to primary winding 221. Although the windings of transformer 220 are intended to be magnetically coupled, there may also be a certain amount of capacitive coupling, or "stray" or "parasitic" capacitance, between windings 221 and 222, which will be referred to herein as "interwinding capacitance." This interwinding capacitance may cause such noise to be transmitted from primary winding 221 to secondary winding 222. This noise may thus also be referred to as "capacitively coupled noise." Especially since such windings are supposed to be isolated, such communication of noise to the secondary winding is undesirable for various reasons. For example, this noise can detrimentally affect the demodulation process and introduce noise and thus errors into the demodulated output signal.

This problem may be exacerbated when transformers are miniaturized, for example for use in integrated circuits ("ICs"), since the windings are located relatively close to one another compared to non-miniaturized transformers, which tends to increase interwinding capacitance. The problem may be further exacerbated if planar transformers are utilized if their configuration further tends to increase interwinding capacitance. In a standard transformer, the windings may be close to one another on the core, also tending to increase interwinding capacitance. The existence of interwinding capacitance in a transformer that is to be used for isolation purposes is thus problematic.

Referring now to FIG. 3, there is illustrated a prior art isolation circuit 300 using a differential capacitor signal barrier. In this approach, a frequency modulator 310 and demodulator 330 are coupled by capacitors 321, 322. Capacitors 321 and 322 allow frequency-modulated AC signals to pass, but block DC, thus providing isolation and a signal barrier. Such an approach does not necessarily entail the use of a transformer and its concomitant interwinding capacitance, and also tends to reject low frequency noise. However, because a capacitor's reactance drops with increasing frequency, it is not able to adequately block high-frequency noise, such as transients, from being coupled between the modulator and demodulator. The modulator 310 and demodulator 320 sides of circuit 300 thus do not adequately serve as signal barriers with respect to sufficiently high-frequency noise.

Referring now to FIG. 4, there is illustrated a prior art isolation circuit 400 using an optical isolator signal barrier. In this approach, a frequency modulator 410 and demodulator 430 are coupled by way of electrically-isolated light-emitting diode ("LED") 421 and light-sensitive diode 422.

An input signal is frequency modulated by frequency modulator 410 to drive LED 421, which transmits corresponding light signals to diode 422, which is configured to respond to the light emitted by LED 421. Frequency demodulator 430 demodulates the signal generated by diode 422 to provide an output signal. Since the modulator and demodulator sides of circuit 400 need not be electrically coupled, circuit 400 provides isolation and acts as a signal barrier. Such an approach does not necessarily entail the use of a transformer and its concomitant interwinding capacitance. However, such a means of providing isolation can be expensive and bandwidth limited. Optical isolators may also be difficult to utilize in miniaturized applications, such as in ICs or even in printed-circuit boards ("PCBs").

There is, therefore, a need for improved apparatuses and methods for providing for signal isolation while reducing interwinding capacitance.

SUMMARY

There is provided herein a planar transformer. According to one embodiment of the invention, the planar transformer has a first winding, a first conducting surface adjacent to the first winding, a second winding and a second conducting surface adjacent to the second winding. The first conducting surface is coupled to a first ground and the second conducting surface is coupled to a second ground.

BRIEF DESCRIPTION OF THE DRAWINGS

These and other features, aspects, and advantages of the present invention will become more fully apparent from the following description, appended claims, and accompanying drawings in which:

FIG. 6 is a cross sectional view of the integrated planar transformer circuit of FIG. 5;

FIG. 7 is a schematic circuit diagram illustrating the integrated planar transformer circuit of FIG. 5 in further detail; and FIG. 8 illustrates an alternative transformer in accordance with an alternative preferred embodiment of the present invention.

DESCRIPTION OF THE PREFERRED EMBODIMENT

In the present invention, a planar transformer is used in an application such as an isolation amplifier or for signal coupling, and has conducting screens between the planar windings to reduce the interwinding capacitance between the primary and secondary circuits of the transformer. In further embodiments the device is miniaturized. In another embodiment a capacitor is coupled in parallel across the secondary winding to tune the secondary circuit to resonate at the same frequency as the modulation or carrier signal to further enhance noise rejection. These and other features are described in further detail below.

Planar Transformer Layers

Figure 1:
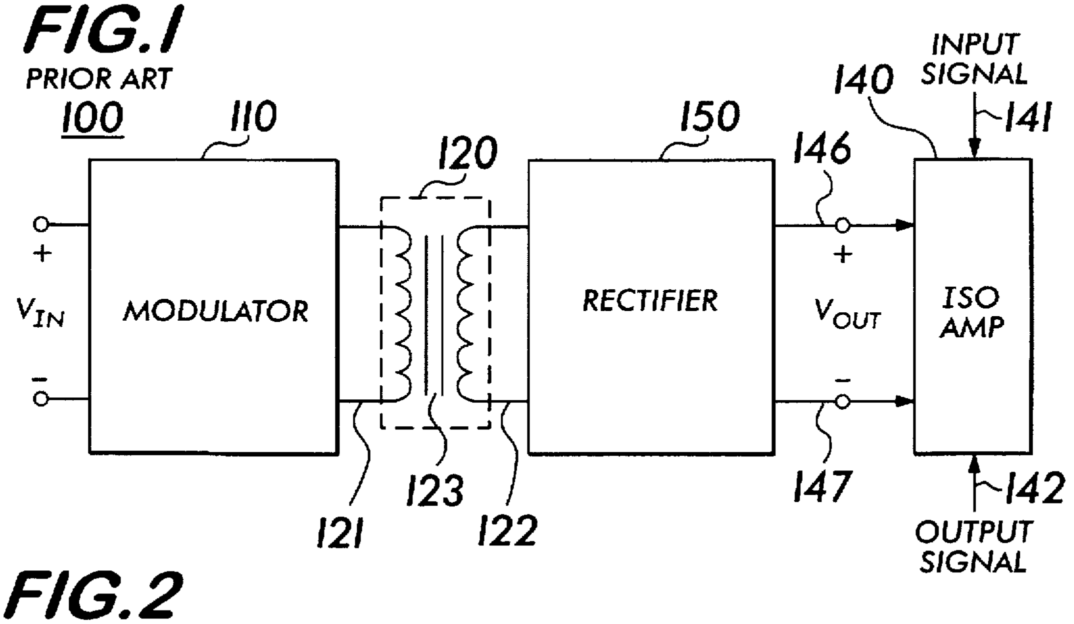
FIG. 1 PRIOR ART
FIG. 1 is a prior art DC—DC converter circuit.
Figure 2:
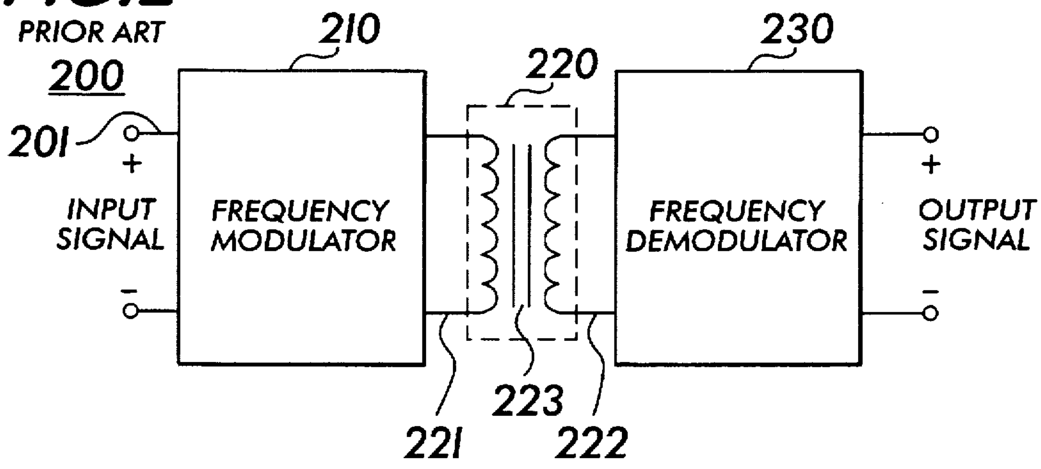
FIG. 2 PRIOR ART
FIG. 2 is a prior art data coupling circuit.
Figure 3:
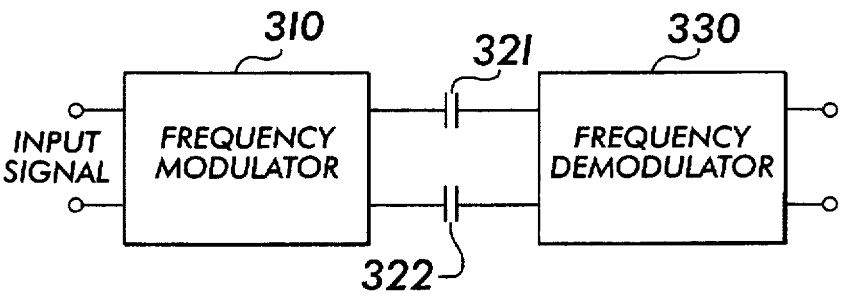
FIG. 3 PRIOR ART
FIG. 3 is a prior art isolation circuit using a differential capacitor signal barrier.
Figure 4:
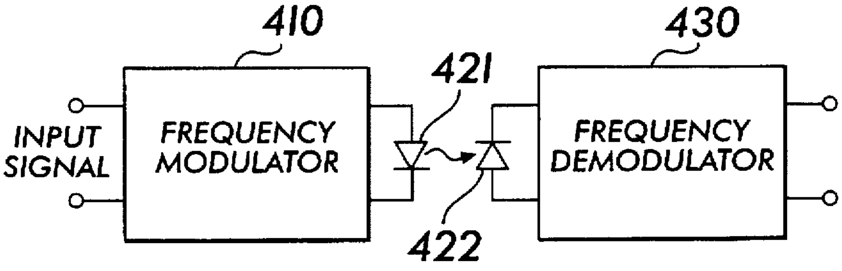
FIG. 4 PRIOR ART
FIG. 4 is a prior art isolation circuit using an optical isolator signal barrier.
Figure 5:
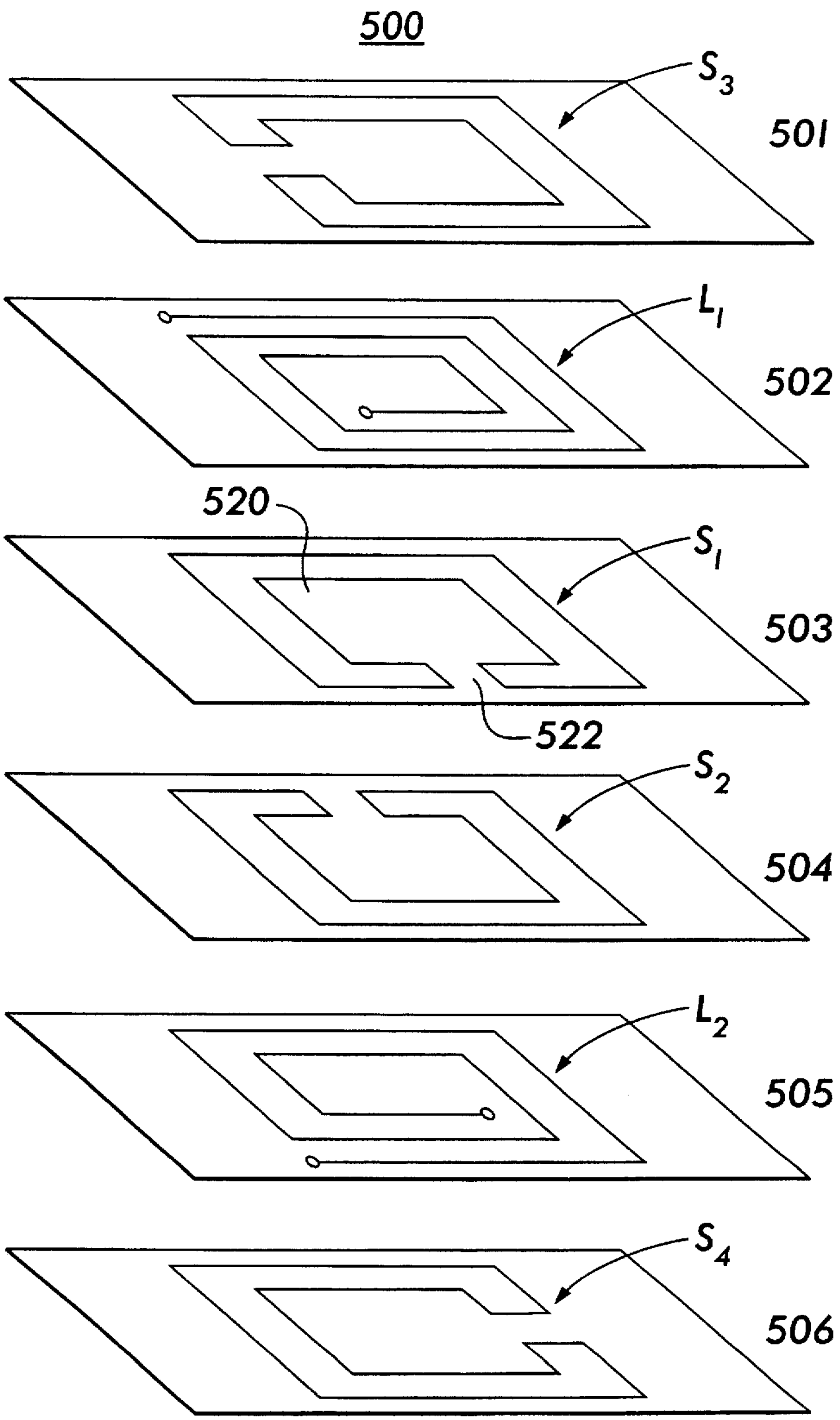
FIG. 5 is a layer diagram showing the layers of an integrated planar transformer circuit, according to a preferred embodiment of the present invention.

Referring now to FIG. 5, there is shown a layer diagram showing the layers of an integrated planar transformer circuit 500, according to a preferred embodiment of the present invention. Circuit 500 is a planar transformer circuit formed of various circuit components, some of which lie in planes placed atop one another. Circuit 500 comprises primary winding $L_1$ in layer 502 and secondary winding $L_2$ in layer 504, as well as four shields or screens, $S_1$, $S_2$, $S_3$, and $S_4$, lying in layers 503, 504, 501, and 506, respectively.

Screens $S_1$ and $S_2$ are placed on layers 503 and 504, between windings $L_1$ and $L_2$, and form electrostatic screens or conducting surfaces between these windings. Screens $S_1$ and $S_2$ thus serve to reduce the interwinding capacitance between windings $L_1$ and $L_2$, as described further below and with reference to FIG. 7. Screens $S_3$ and $S_4$ are formed on outer layers 501 and 506, respectively, and serve to reduce any external fields generated by the transformer comprising windings $L_1$ and $L_2$. Screens $S_3$ and $S_4$ also reduce the effect of any external magnetic or electrical fields on the operation of the transformer.

Each of the components illustrated in layers 501–506 in FIG. 5 are shaped, in one embodiment, with a rectangular hole section, as shown, for example, in hole 520 of layer 503. The hole allows the magnetic field to pass through the components and thus through the two transformer windings $L_1$ and $L_2$. Further, as illustrated, in one embodiment the screens are "C" shaped, with a gap such as gap 522 of screen $S_1$, to prevent eddy currents from circulating in the bulk of each screen. As will be understood, this helps to keep the Q of circuit 500 high. Solid screens may also be utilized in alternative embodiments, although without hole 520 magnetic flux communication may be less efficient.

In one embodiment, circuit 500 is formed as part of an IC. In another embodiment, circuit 500 is formed in layers of a PCB. Each component may be fabricated with suitable IC or PCB technology. In one embodiment, each winding $L_1$ and $L_2$ is constructed as part of a metallized substrate made from etched copper tracks, with an interposing insulating film, as described in FIG. 6, which illustrates a cross-sectional view of integrated planar transformer circuit 500 of FIG. 5.

Screens $S_1$ and $S_2$ may also be formed by depositing the screens onto the surface of a silicon substrate using standard IC processing techniques. For example, such a transformer may be fabricated to operate in the 5–20 MHz range, by using a two-level metal deposition process.

In this process, a silicon substrate has a $SiO_2$ field grown on the surface, and an aluminum screen ($S_1$) is deposited on top of the oxide. A second $SiO_2$ oxide is then grown on top of this layer, and a second aluminum layer in the form of a spiral is deposited to form primary winding $L_1$. A glass passivation layer is then deposited to seal this half of the transformer, and is illustrated as the substrate between layers 501 and 502 of FIG. 6. A second die or silicon substrate has an identical structure to form screen $S_2$ and secondary winding $L_2$. An insulating layer also separates the two screens $S_1$ and $S_2$, as shown in the material between layers 503 and 504 in FIG. 6.

Planar screens and transformer coils in accordance with the present invention may also be fabricated with other suitable materials, such as copper. A transformer may also be created with a single metal process, as will be appreciated by those skilled in the art. In such a process, a screen, for example, is composed of an n+ or p+ diffused screen, in which a depletion layer (n+ for a p substrate or p+ for an n substrate) shaped like the component (e.g., a "C" shaped screen) is diffused into a surface. Such components may yield inferior noise performance than the two-metal process described above, but still provide an improvement over non-screened transformers.

Planar Transformer Circuit Diagram

Referring now to FIG. 7, there is illustrated a schematic circuit diagram showing integrated planar transformer circuit 500 of FIG. 5 in further detail. As shown, circuit 500 comprises frequency modulator 710, frequency demodulator 730, $S_1$, $S_2$, $L_1$, and $L_2$. A capacitor $C_{L2}$ is coupled in parallel with secondary winding $L_2$. Primary winding $L_1$ and screen $S_1$ are grounded to ground 761. Secondary winding $L_2$ and screen $S_2$ are grounded to ground 762, which is electrically isolated from ground 762.

As will be appreciated, in an alternative embodiment, windings $L_1$ and/or $L_2$ may not be directly grounded to their respective grounds 761 and 762. For example, frequency modulator 710 and shield $S_1$ may both be coupled to ground 761, with primary winding run differentially without being grounded, and thus only loosely coupled to ground 761 through modulator 710 and shield $S_1$. Similarly, $L_2$ may also be loosely coupled to ground 762, preferably if care is taken to limit the common mode voltage travel on the input to demodulator 730.

The capacitance existing between various components is illustrated as follows: interwinding capacitance $C_{L1-L2}$; primary capacitance $C_P$; secondary capacitance $C_S$; and interscreen capacitance $C_{P-S}$. It will be appreciated that $C_{L1-L2}$, $C_P$, $C_S$, and $C_{P-S}$ are not actual capacitor components interconnected into circuit 500, but rather illustrations of capacitance that ineluctably exists between any two electrical components separated by a distance.

An input signal is received by frequency modulator 710, which applies a modulated voltage signal $V_1$ to primary winding $L_1$, which causes an accompanying current $I_1$. A magnetic field passes through an "air core" through the hole 520 as shown in FIG. 5, to transmit the modulated signal in electrically isolated fashion from primary winding $L_1$ to secondary winding $L_2$. The current $I_2$ induced in secondary winding $L_2$ is demodulated by frequency demodulator 730 to provide an output signal.

As will be understood, circuit 500 may be viewed as comprising a modulator circuit and demodulator circuit (or subcircuits), electrically isolated from one another. As will be further appreciated, circuit 500 thus helps to prevent noise from being coupled between the modulator and demodulator subcircuits, since the screens $S_1$ and $S_2$ serve to reduce the effects of interwinding capacitance $C_{L1-L2}$. For example, without screens $S_1$ and $S_2$, a transient noise pulse applied to primary winding $L_1$ may be communicated to secondary winding $L_2$ by way of the interwinding capacitance, if the noise is of sufficiently high frequency. However, such noise would instead be communicated first from primary winding $L_1$ to screen $S_1$ by way of the inherent or intrinsic capacitance $C_P$ that exists therebetween, and thence is shunted to ground 761. Noise applied to secondary winding $L_2$ similarly is communicated to screen $S_2$ and shunted to ground 762. Thus, isolation is maintained even with very high frequency noise.

Tuning Capacitor

In a further embodiment, tuning capacitor $C_{L2}$ is coupled in parallel with secondary winding $L_2$ to tune the demodulator circuit to resonate at the same frequency as the carrier frequency used by frequency modulator 710. As will be appreciated, such resonation can enhance the noise rejection capacity of the demodulator circuit, since the reactance of the tank circuit formed by $L_2$ and tuning capacitor $C_{L2}$ at frequencies significantly above the carrier frequency acts as an additional attenuator to noise that would otherwise be communicated from the modulator to the demodulator circuit.

As will be appreciated, such a resonance approach forms a bandpass filter comprising $L_1$, $L_2$, and $C_{L2}$. The bandpass filter's cut-off frequency is set by $L_2$ and $C_{L2}$, and its bandwidth is set by $L_2$, $C_{L2}$, and the inductor $L_2$'s series resistance (not shown). The Q of the circuit boosts the small signal from the input into something measurable (e.g., typically greater than 20 mV to 30 mV). Transient signals inevitably have an effect on the output because of $C_{L1-L2}$. As will be understood, the smaller that $C_{L1-L2}$ can be made, the smaller the effect from such transients. Without $C_{L2}$, the signal from a transient increases with increasing frequency because of the reduction of the impedance of $C_{L1-L2}$ and because of the increase in impedance of $L_2$ with frequency. If $C_{L2}$ is added, the impedance of the parallel combination of $L_2$ and $C_{L2}$ will increase until resonance, and then will begin to fall due to the influence of $C_{L2}$. Ultimately, the signal would become capacitively divided, but since $C_{L2}$ is much greater in value than the parasitic $C_{L1-L2}$, the apparent output voltage is greatly reduced. In one embodiment, $C_{L2}$ is 1 nF and $C_{L1-L2}$ is 0.1 pF, which provides an attenuation of 10,000:1 in voltage due to transients at very high frequency.

Spiral Screen on Core

Referring now to FIG. 8, there is shown an alternative transformer 800 in accordance with an alternative preferred embodiment of the present invention. Transformer 800 comprises a core 810, as well as windings $L_1$ and $L_2$ and screens $S_1$ and $S_2$. Windings $L_1$ and $L_2$ and screens $S_1$ and $S_2$ are coupled to circuitry as illustrated in FIG. 7. Instead of planar windings as described above, windings $L_1$ and $L_2$ may also be standard windings wrapped around a transformer core 810. These windings may be located near each other and separated by a distance x, which may, for example, be as small as ½ inch or less. An interwinding capacitance can exist in such a configuration, as will be appreciated by those skilled in the art. First, there may be "direct" interwinding capacitance between the windings, which is increased in accordance with the windings' proximity to one another. There may also be a parasitic capacitance between each winding and the core 810 itself, which may be referred to as winding-core capacitances. Since the core itself may be electrically conductive, the two winding-core capacitances are coupled in series by the core and thus provide an interwinding capacitance. Interwinding capacitance for a standard core transformer may exist due to the above-described direct interwinding capacitance as well as due to the winding-core capacitances.

As discussed above with respect to planar transformers, two conducting surfaces or screens may placed adjacent to each winding $L_1$, $L_2$ to reduce the effects caused by such interwinding capacitance. As illustrated, screens $S_1$ and $S_2$ may be wrapped in a spiral around the surface section of core 810 underneath each winding, where each screen lies between its respective winding and the surface of core 810. These screens serve primarily to reduce the winding-core capacitances described above, and the associated interwinding capacitance causedby these winding-core capacitances.

Each screen may be composed of a thin metal material such as foil, and backed with an insulating material to provide electrical isolation between the screen and core. For example, a metal or foil-type tape may be wrapped around the core 810 to provide screens $S_1$ and $S_2$. Preferably, a spiral shape is utilized to reduce eddy currents and also to improve communication of flux between core 810 and each winding $L_1$, $L_2$, similar to the advantages obtained from the "C" shaped screens described above with reference to FIG.

5. Alternatively, sleeve or collar shaped screens (not shown) may be utilized instead of the spiral shape illustrated in FIG. 8. The foil or other material of each screen is preferably thin relative to the penetration depth (the skin effect) at the carrier frequency of the modulation so that the H field can pass to and from core 810 through the screens to each respective winding.

As illustrated, each spiral screen also contains a flange, flange 811 for screen $S_1$ and flange 812 for screen $S_2$. These flanges are lips or projections that extend more or less perpendicularly away from the surface of core 810, on the sides of windings $S_1$ and $S_2$ that are nearest each other. The purpose of flanges 811 and 812 is to help block the effects of the "direct" interwinding capacitance between windings $S_1$ and $S_2$.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. A transformer, comprising:

(a) a first winding;

(b) a first conducting surface adjacent to the first winding;

(c) a second winding; and (d) a second conducting surface adjacent to the second winding;

wherein the first conducting surface is coupled to a first ground and the second conducting surface is coupled to a second ground.

2. The transformer of claim 1, wherein:

the first winding is in a first plane;

the first conducting surface is in a second plane between the first plane and a third plane;

the second conducting surface is in the third plane between the second plane and a fourth plane; and the second winding is in a fourth plane.

3. The transformer of claim 2, wherein the first conducting surface is coupled to the first winding and the second conducting surface is coupled to the second winding.

4. The transformer of claim 2, wherein the first winding is coupled to a frequency modulator for modulating an input signal in accordance with a carrier frequency.

5. The transformer of claim 4, further comprising a tuning capacitor coupled to the second winding to cause the second winding to resonate at the carrier frequency.

6. The transformer of claim 2, wherein the first and second conducting surfaces are screens having a central opening for allowing a magnetic field to pass therethrough for magnetic coupling of the first and second windings.

7. The transformer of claim 6, wherein:

the first and second windings are planar spiral coils, each comprising winding around a perimeter area around a respective central opening;

the central openings of the first winding, second winding, first screen, and second screen are aligned and provide a path for the magnetic field to pass therethrough.

8. The transformer of claim 6, wherein the first and second screens are C shaped around the central opening.

9. The transformer of claim 2, wherein the first and second windings are planar spiral coils, each in a respective surface.

10. The transformer of claim 2, wherein the first through fourth planes are formed in surfaces of layers of an integrated circuit.

11. The transformer of claim 2, wherein the first through fourth planes are formed in surfaces of layers of a printed circuit board.

12. The transformer of claim 2, further comprising:

(e) a third conducting surface in a fifth plane, wherein the first plane is between the second and fifth planes; and (f) a fourth conducting surface in a sixth plane, wherein the fourth plane is between the third and sixth planes.

13. The transformer of claim 2, wherein each plane of the first through fourth planes is separated from adjacent planes of the first through fourth planes by at least one layer of insulating material.

14. The transformer of claim 1, further comprising a core, wherein:

the first winding is wrapped around a first surface section of the core;

the first conducting surface is interposed between the first winding and the first surface section of the core;

the second winding is wrapped around a second surface section of the core; and the second conducting surface is interposed between the second winding and the second surface section of the core.

15. The transformer of claim 14, wherein:

the first conducting surface comprises a flanged edge extending away from the first surface section of the core and over an end of the first winding that is closest to an end of the second winding; and the second conducting surface comprises a flanged edge extending away from the second surface section of the core and over the end of the second winding.

16. The transformer of claim 14, wherein:

the first conducting surface comprises a spiral shaped surface wrapped around the first surface section of the core; and the second conducting surface comprises a spiral shaped surface wrapped around the second surface section of the core.

17. The transformer of claim 14, wherein the first conducting surface is coupled to the first winding and the second conducting surface is coupled to the second winding.

18. The transformer of claim 14, wherein the first winding is coupled to a frequency modulator for modulating an input signal in accordance with a carrier frequency.

19. The transformer of claim 18, further comprising a tuning capacitor coupled to the second winding to cause the second winding to resonate at the carrier frequency.

20. A method, comprising the steps of:

modulating an input signal to provide a modulated input signal;

applying the modulated input signal to a first winding of a transformer, wherein:

the transformer further comprises a first conducting surface adjacent to the first winding, a second winding, and a second conducting surface adjacent to the second winding;

a modulated output signal is produced at the second winding; and the first conducting surface is coupled to a first ground and the second conducting surface is coupled to a second ground.

21. The method of claim 20, further comprising the step of demodulating the modulated output signal to provide an unmodulated output signal.

22. The method of claim 20, wherein:

the first winding is in a first plane;

the first conducting surface is in a second plane between the first plane and a third plane;

the second conducting surface is in the third plane between the second plane and a fourth plane; and the second winding is in a fourth plane.

23. The method of claim 22, wherein the first conducting surface is coupled to the first winding and the second conducting surface is coupled to the second winding.

* * * * *